US006694474B2

(12) United States Patent
Ramprashad et al.

(10) Patent No.: US 6,694,474 B2
(45) Date of Patent: Feb. 17, 2004

(54) CHANNEL CODING WITH UNEQUAL ERROR PROTECTION FOR MULTI-MODE SOURCE CODED INFORMATION

(75) Inventors: Sean Anthony Ramprashad, Basking Ridge, NJ (US); Carl-Erik Wilhelm Sundberg, Chatham, NJ (US); Hervé Taddei, Munich (DE)

(73) Assignee: Agere Systems Inc., Allentown, PA (US)

( * ) Notice: Subject to any disclaimer, the term of this patent is extended or adjusted under 35 U.S.C. 154(b) by 421 days.

(21) Appl. No.: 09/814,505

(22) Filed: Mar. 22, 2001

(65) Prior Publication Data

US 2002/0178418 A1 Nov. 28, 2002

(51) Int. Cl.[7] ..................... H03M 13/00; H03M 13/03; H04L 23/02
(52) U.S. Cl. ..................... 714/755; 375/262; 714/790; 714/795
(58) Field of Search ................. 714/755, 752, 714/746, 758, 782, 783, 784, 786, 790, 792, 795, 52; 375/265, 262

(56) References Cited

U.S. PATENT DOCUMENTS 5,706,335 A  * 1/1998 Hinderks ............... 379/399.02
5,841,819 A  * 11/1998 Hu et al. .................... 375/341
5,883,899 A  * 3/1999 Dahlman et al. ........... 370/468

OTHER PUBLICATIONS

S.A. Ramprashad, "A Multimode Transform Predictive Coder (MTPC) for Speech and Audio," IEEE Workshop on Speech Coding, pp. 10–12, Porvoo, Finland, Jun. 1999.
S.A. Ramprashad, "High Quality Embedded Wideband Speech Coding Using an Inherently Layered Coding Paradigm," IEEE International Conference on Acoustics, Speech and Signal Processing, pp. II–1145 to II–1148, Istanbul, Turkey, Jun. 2000.
E. Cohen and H.–L. Lou, "Multi–Rate Detection for the IS–95 CDMA Forward Traffic Channels," Proceedings of the IEEE Global Telecommunications Conference (GLOBECOM), vol. 3, pp. 1789–1793, Singapore, Nov. 1995.
J. Hagenauer et al., "The Performance of Rate–Compatible Punctured Convolutional Codes for Digital Mobile Radio," IEEE Trans. on Communications, 38(7), pp. 966–980, Jul. 1990.
J. Hagenauer, "Rate–Compatible Punctured Convolutional Codes (RCPC codes) and their Applications," IEEE Transactions on Communications, vol. 36, No. 4, pp. 389–400, Apr. 1988.

(List continued on next page.)

Primary Examiner—Christine T. Tu
(74) Attorney, Agent, or Firm—Ryan, Mason & Lewis, LLP

(57) ABSTRACT

Source-coded information from a multi-mode source encoder is channel coded for transmission in a communication system. A multi-mode channel encoder associates a different channel coding error protection profile with each of the modes of the multi-mode source encoder. The channel encoder determines a mode used by the multi-mode source encoder to source code a given frame or other designated portion of the information, and channel codes the source-coded portion of the information utilizing an error protection profile identified at least in part based on the determined mode. A multi-mode channel decoder is operative to hypothesize that a particular one of the modes of the multi-mode source encoder was used to source code the designated portion of the information. The channel decoder analyzes at least part of a set of corresponding channel-coded information using an error protection profile associated with the hypothesized mode of the multi-mode source encoder, in order to determine if the error protection profile and the hypothesized mode are appropriate for respective channel decoding and source decoding of the designated portion of the information.

20 Claims, 7 Drawing Sheets

OTHER PUBLICATIONS

N. Seshadri and C–E. W. Sundberg, "List Viterbi Decoding Algorithms with Applications," IEEE Transactions on Communications, vol. 42, pp. 313–323, Feb./Mar./Apr. 1994.

C. Nill and C–E. W. Sundberg, "List and Soft Symbol Output Viterbi Algorithms: Extensions and Comparisons," IEEE Transactions on Communications, vol. 43, Feb./Mar./Apr. 1995, pp. 277–286.

R.V. Cox and C.–E.W. Sundberg, "An Efficient Adaptive Circular Viterbi Algorithm for Decoding Generalized Tail-biting Convolutional Codes," IEEE Transactions on Vehicular Technology, vol. 43, No. 1, pp. 57–68, Feb. 1994.

* cited by examiner

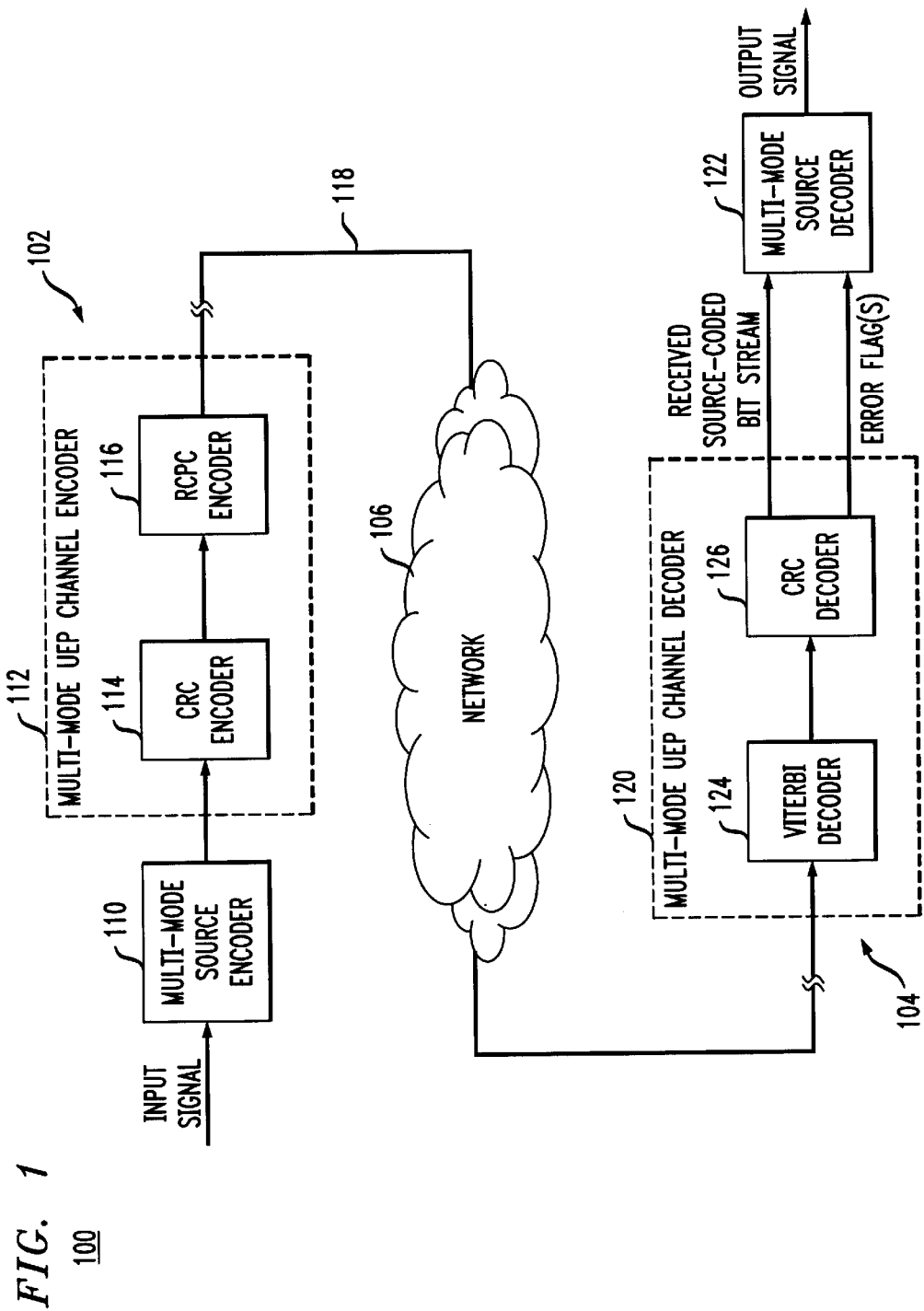

CHANNEL CODING WITH UNEQUAL ERROR PROTECTION FOR MULTI-MODE SOURCE CODED INFORMATION

FIELD OF THE INVENTION

The present invention relates generally to communication systems, and more particularly to channel coding techniques for use in communication systems which incorporate multi-mode source encoders.

BACKGROUND OF THE INVENTION

A multi-mode source encoder supports multiple coding modes, with each coding mode designed to provide optimal coding for a particular type of source signal. An example of a multi-mode source encoder known in the art is the multi-mode transform predictive coding (MTPC) encoder. The MTPC encoder is a wideband (7 kHz) encoder used for compression of speech and audio signals, at nominal source bit rates from about 13 kbits/sec to 40 kbits/sec. The MTPC encoder is based on a transform predictive coding paradigm which combines linear predictive coding with transform coding. This combination allows the MTPC encoder to incorporate both speech and audio coding principles into a single coding structure having a speech coding mode and an audio coding mode. Additional details regarding the MTPC encoder can be found in, e.g., S. A. Ramprashad, "A multimode transform predictive coder (MTPC) for speech and audio," IEEE Workshop on Speech Coding, pp. 10–12, Porvoo, Finland, June 1999, and S. A. Ramprashad, "High quality wideband embedded coding using an inherently layered coding paradigm," IEEE International Conference on Acoustics, Speech and Signal Processing, pp. II-1145 to II-1148, Istanbul, Turkey, June 2000, both of which are incorporated by reference herein.

In communication system applications, a compressed source-coded bit stream such as that generated by the MTPC is transmitted via a system transmission channel to a receiver that includes a source decoder. Examples of such transmission channels include wireless network channels such as cellular system channels and terrestrial and satellite digital broadcast channels, packet network channels such as asynchronous transfer mode (ATM) or Internet protocol (IP) channels, and circuit switched network channels such as integrated services digital network (ISDN) channels. During transmission, errors can be introduced into the source-coded bit stream. Channel coding techniques are often used to limit the impact of such transmission errors on reconstructed signal quality at the receiver.

An example channel coding technique utilized in IS-95 code division multiple access (CDMA) cellular systems is described in E. Cohen and H. -L. Lou, "Multi-rate detection for the IS-95 forward traffic channels," Proceedings of the IEEE Global Telecommunications Conference (GLOBECOM), Vol. 3, pp. 1789–1793, Singapore, November 1995, which is incorporated by reference herein. In this technique, a source encoder can operate at a number of different rates, and the channel encoder configures the channel-coded frames so as to have the same size regardless of the particular source coding rate. For example, information source coded at ½ of a full rate is repeated twice within a given channel-coded frame such that the resulting channel-coded frame is the same size as that generated from information source coded at the full rate. Rate detection at the receiver is used to determine the particular channel coding configuration for a given frame.

Although these and many other channel coding techniques are known in the art, a need exists nonetheless for improved channel coding techniques particularly well suited for use with multi-mode source encoders such as the above-described MTPC encoder.

SUMMARY OF THE INVENTION

The present invention provides methods and apparatus for channel coding in a communication system that includes a multi-mode source encoder.

In accordance with one aspect of the invention, source-coded information from the multi-mode source encoder is channel coded for transmission in the communication system. A multi-mode channel encoder associates different channel coding error protection profiles with each of the modes of the multi-mode source encoder. The channel encoder determines a mode used by the multi-mode source encoder to source code a given frame or other designated portion of the information, and channel codes the source-coded portion of the information utilizing an error protection profile identified at least in part based on the determined mode.

An illustrative embodiment of the invention utilizes a cyclic redundancy check (CRC) or other error detecting code as an outer channel code, and a set of rate-compatible punctured convolutional (RCPC) codes as an inner channel code. The CRC in this illustrative embodiment protects a portion of each frame of a source-coded bit stream, and this CRC-protected portion for a given frame includes one or more mode bits identifying a source coding mode used to source code the given frame. The CRC may also be configured so as to be suitable for use in generating an error flag for triggering an error mitigation algorithm in a source decoder.

In accordance with another aspect of the invention, a multi-mode channel decoder is operative to hypothesize that a particular one of the modes of the multi-mode source encoder was used to source code the designated portion of the information. The channel decoder analyzes at least part of a set of corresponding channel-coded information using an error protection profile associated with the hypothesized mode of the multi-mode source encoder, in order to determine if the error protection profile and the hypothesized mode are appropriate for respective channel decoding and source decoding of the designated portion of the information. The part of the corresponding channel-coded information that is analyzed preferably is a part containing source mode bits generated for a given source-coded frame of the information by the multi-mode source encoder.

The particular one of the modes of the multi-mode source encoder hypothesized as having been used to source code the designated portion of the information may be selected by performing a Viterbi decoding each of the different modes, and selecting the hypothesized mode based at least in part on a result of the Viterbi decoding, e.g., based on which of the modes resulted in the best path metric. As another example, the particular one of the modes of the multi-mode source encoder hypothesized as having been used to source code the designated portion of the information may be selected based in part on mode bits from a previous successfully-decoded frame.

Advantageously, the present invention, by adapting the error protection profile based on the source coding mode, can provide improved reconstructed signal quality for a given channel signal-to-noise ratio (SNR), regardless of the particular source coding mode used and thus regardless of the type of input signal, e.g., speech or audio.

BRIEF DESCRIPTION OF THE DRAWINGS

FIG. 1 is a block diagram of a communication system in accordance with an illustrative embodiment of the invention.

DETAILED DESCRIPTION OF THE INVENTION

Figure 2A:
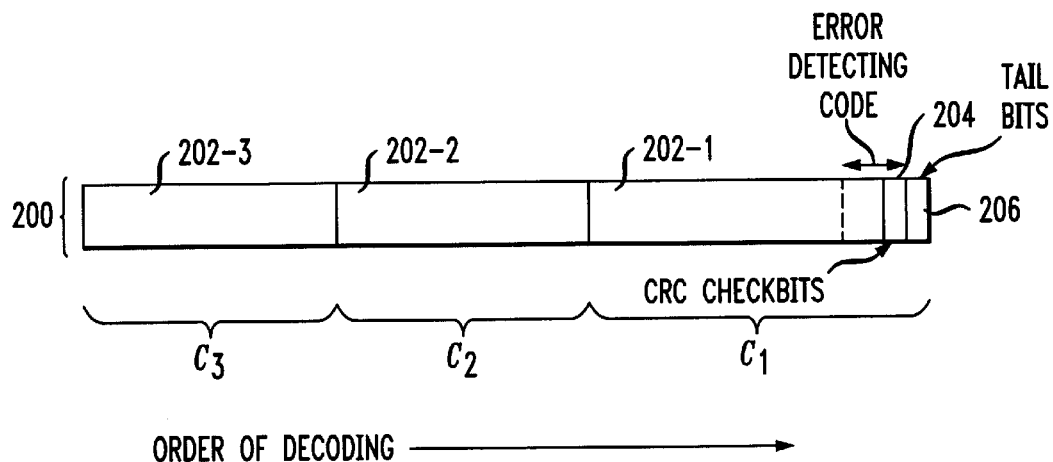
FIGS. 2A and 2B illustrate forward and backward decoding methods, respectively, in accordance with the invention.

FIG. 1 shows a communication system 100 in accordance with an illustrative embodiment of the invention. The system 100 includes a transmitter 102 and a receiver 104, which communicate over a transmission channel of a network 106. The network 106 may represent a wireless network, a packet network, or a circuit-switched network, as well as portions or combinations of these and other networks.

The transmitter 102 includes a multi-mode source encoder 110 which receives an input analog signal, e.g., a speech signal or an audio signal, and generates an output source-coded bit stream. It is assumed for the description of the illustrative embodiment that the multi-mode source encoder 110 is a multi-mode transform predictive coding (MTPC) encoder having both a speech coding mode and an audio coding mode, as described in greater detail in the above-cited S. A. Ramprashad references. However, it will be appreciated by those skilled in the art that the techniques of the invention are readily applicable for use with any other type of multi-mode source encoder, and for use with types of information other than speech and audio, e.g., image, video or data.

The transmitter 102 further includes a multi-mode unequal error protection (UEP) channel encoder 112 configured in accordance with the invention. The multi-mode UEP channel encoder 112 in this embodiment includes a cyclic redundancy check (CRC) encoder 114 and a rate-compatible punctured convolutional (RCPC) encoder 116, although other types of encoders could be used. For example, the CRC code could be replaced with another type of error detecting code, and the RCPC could be replaced with another type of convolutional or non-convolutional channel code.

The CRC encoder 114 generates a number of CRC check bits for each frame of the source-coded bit stream received from the multi-mode source encoder 110. It should be noted that the CRC in the illustrative embodiment covers only a portion of a given frame of the source-coded bit stream, and that this portion includes information identifying the source coding mode used for that frame. The information identifying the source coding mode may, but need not, include one or more mode bits. More particularly, as an alternative to the use of mode bits, the source coding mode may be inferred from other information associated with a particular source coding mode, e.g., an audio coding mode may be inferred from the presence of a transform length indicator.

The RCPC encoder 114 then applies one of a number of different error protection profiles to the combined source-coded bits and CRC check bits associated with a given frame, based on which mode of the multi-mode source encoder 110 was used to source code that frame. More particularly, the RCPC encoder 116 is configured in accordance with the invention to determine the source coding mode used for the given frame, typically by using the one or more mode bits generated by the multi-mode source encoder 110 and included as part of the source-coded bit stream, and to adjust its code rates accordingly so as to provide the desired error protection profile.

Different error protection profiles are desirable for the different source coding modes because the source-coded bit streams for the different modes are configured differently and different portions thereof have different error sensitivities. This is not surprising as each mode of the MTPC encoder has a different bitstream syntax often representing different coding parameters. For example, in the case of the above-noted MTPC encoder, a source-coded bit stream generated in the audio coding mode generally has more so-called "side" information than a stream generated in the speech coding that generated the speech mode. This side information includes, e.g., line spectral parameters (LSPs) and subband gain parameters, as well as the coding mode. In addition, the audio coding mode relies more heavily on quantized transform coefficients to represent the input signal. The speech mode, in contrast, models spectral time structure largely by the LSP coefficients, subbands gains and a long-term predictor. As a result of these and other differences between the coding modes, certain bits of one mode are more sensitive to errors that the same bits of the other mode.

Advantageously, the present invention, by adapting the error protection profile based on the source coding mode, can provide improved reconstructed signal quality for a given channel signal-to-noise ratio (SNR), regardless of the particular source coding mode used and thus regardless of the type of input signal, e.g., speech or audio.

In the illustrative embodiment, the RCPC encoder 116 is configured to support at least two different error protection profiles, a first profile for use with frames that have been source coded using the speech coding mode of the multi-mode source encoder 110, and a second profile for use with frames that have been source coded using the audio coding mode of the multi-mode source encoder 110. An example of a frame that is channel coded in accordance with an error protection profile of the invention will be described in conjunction with FIGS. 2A and 2B.

The RCPC encoder 116 may utilize conventional RCPC codes known in the art, such as those described in J. Hagenauer et al., "The Performance of Rate-Compatible Punctured Convolutional Codes for Digital Mobile Radio," IEEE Trans. on Communications, 38(7), pp. 966–980, July 1990, and J. Hagenauer, "Rate-compatible punctured convolutional codes (RCPC codes) and their applications," IEEE Transactions on Communications, Vol. 36, No. 7, pp. 389–400, April 1988, both of which are incorporated by reference herein.

The CRC encoder 112 and RCPC encoder 116 in the channel encoder 112 implement an outer channel code and an inner channel code, respectively. It should be again be emphasized that the particular types of outer and inner channel codes used in this embodiment are examples only. The invention can be implemented using other types of inner and outer codes.

An input of the receiver 104 is coupled to an output of the transmitter 102 via a transmission channel 118 associated with the network 106. Those skilled in the art will recognize that both the transmitter 102 and receiver 104 will generally include additional elements not shown in the figure. For example, transmitter 102 may include elements such as modulators, up-converters, inter-leavers, etc., and receiver 104 may include complementary elements. Other elements, such as filters, amplifiers, antennas etc., may also be included.

The receiver 104 includes a multi-mode UEP channel decoder 120 and a multi-mode source decoder 122. The channel decoder 120 includes a Viterbi decoder 124 and a CRC decoder 126, although it should be understood that these are shown by way of example only, and in embodiments using other types of encoders, corresponding complementary decoders will be used.

The Viterbi decoder 124 is responsible for decoding the RCPC code(s) applied in RCPC encoder 116 of transmitter 112, and operates in conjunction with the CRC decoder 126 in a manner to be described below in conjunction with the flow diagrams of FIGS. 3A, 3B, 3C and 4. More particularly, the Viterbi decoder 124 will generate for a given received frame one or more provisional decodings of the RCPC code(s) associated with the different source coding modes and their corresponding error protection profiles. The CRC decoder 126 determines if the CRC check is satisfied for a given provisional decoding so as to provide an indication that a particular hypothesized mode, associated with a given provisional decoding, is appropriate. Additional details regarding the interaction between Viterbi decoder 124 and CRC decoder 126 are provided in conjunction with FIGS. 3A, 3B, 3C and 4. The multi-mode source decoder 122 decodes the received version of the source-coded bit stream as generated by the Viterbi decoder in order to generate a reconstructed version of the original input signal applied to the source encoder 110. One or more error flags from the channel decoder 104 may be utilized to trigger an error mitigation algorithm in the source decoder 122 in a manner well known in the art.

The channel decoder 120 in the illustrative embodiment of FIG. 1 utilizes Viterbi decoding to decode the inner RCPC code(s) applied by RCPC encoder 116, and includes a CRC decoder 126 for performing the outer code CRC check using the CRC check bits generated in the CRC encoder 114. In other embodiments, alternative outer and inner decoding elements, complementary to those used in the transmitter, may be used in the receiver.

The Viterbi decoder 124, and other such inner code decoders referred to herein, may make use of the List Viterbi algorithm (LVA) as described in, e.g., N. Seshadri and C-E. W. Sundberg, "List Viterbi decoding algorithms with applications," IEEE Transactions on Communications, Vol. 42, pp. 311–323, February/March/April 1994, and C. Nill and C-E. W. Sundberg, "List and soft symbol output Viterbi algorithms: Extensions and comparisons," IEEE Transactions on Communications, Vol. 43, February/March/April 1995, both of which are incorporated by reference herein.

Figure 2B:
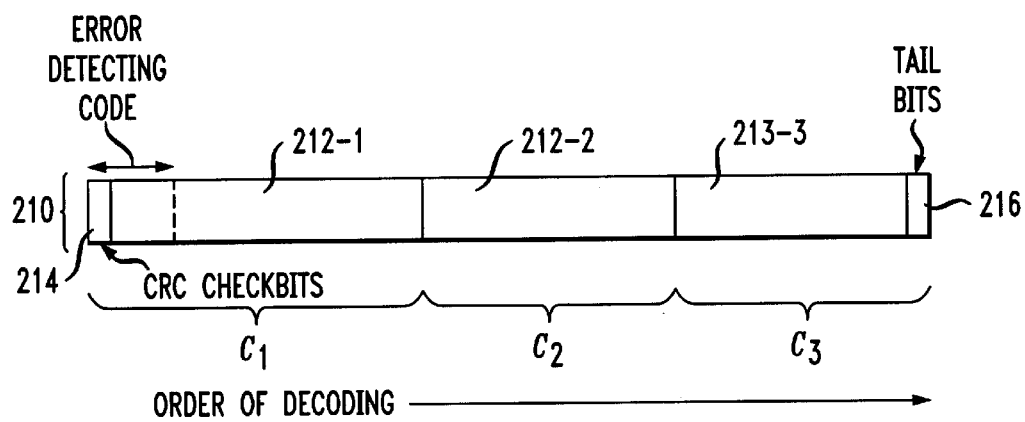

FIGS. 2A and 2B show example frame formats for channel-coded frames generated using the multi-mode UEP channel encoder 112 of FIG. 1. The frame format of FIG. 2A is used in conjunction with forward decoding of the channel-coded frame, which the frame format of FIG. 2B is used in conjunction with reverse decoding of the channel-coded frame. The decoding direction is indicated by a large horizontal arrow in each figure.

Referring to FIG. 2A, a channel-coded frame 200 includes segments 202-1, 202-2 and 202-3, CRC check bits 204, and a set of tail bits 206 used for RCPC code termination. Segments 202-1, 202-2 and 202-2 generally represent portions of a corresponding frame of the source-coded bit stream, arranged in order of the importance of the corresponding bits, with segment 202-1 containing the most important bits and segment 202-3 containing the least important bits. The CRC check bits 204 provide an error detecting code for a designated part of the segment 202-1 as indicated in the figure, and may be used to trigger error mitigation in the source decoder 122. This designated part of the segment 202-1 includes the above-noted information identifying the source coding mode used for the frame. It should be noted that the placement of the CRC boundary as indicated by the vertical dashed line in the figure is by way of example only, and in other embodiments may extend into segments 202-2 or 202-3.

The frame 200 is further protected by an outer code configured in accordance with an error protection profile comprising a set of three RCPC codes. More particularly, the first segment 202-1 and the CRC check bits 204 are protected by a first RCPC code $C_1$ terminated by the tail bits 206, the second segment 202-2 is protected by a second RCPC code $C_2$, and the third segment 202-3 is protected by a third RCPC code $C_3$, where $C_1$ is the most powerful (i.e., lowest rate) code in the set of three codes and $C_3$ the least powerful (i.e., highest rate) code in the set of three codes.

It should be understood that the use of a set of three RCPC codes in the frame formats of FIGS. 2A and 2B is by way of example only, and not intended to limit the scope of the invention in any way. More generally, a set of N RCPC codes $C_1, C_2 \ldots C_N$ may be used in a given RCPC embodiment of the invention. It should also be noted that certain of the codes may be the same for different error protection profiles, e.g., two or more different error protection profiles could utilize the same code $C_1$.

The specific codes most appropriate for use in a given embodiment will generally vary depending upon application-specific factors, and can be determined in a straightforward manner by those of ordinary skill in the art, e.g., through simulation.

The channel-coded frame 200 is channel decoded using the above-noted forward decoding method, in which Viterbi decoding in decoder 124 starts with the least powerful RCPC code $C_3$ and ends with the tail bits 206.

FIG. 2B shows an alternative configuration for a channel-coded frame 210 that includes segments 212-1, 212-2 and 212-3, CRC check bits 214, and a set of tail bits 216. Segments 212-1, 212-2 and 212-2 generally represent portions of a corresponding frame of the source-coded bit stream, arranged in order of the importance of the corresponding bits, with segment 212-1 containing the most important bits and segment 212-3 containing the least important bits. The CRC check bits 214 provide an error detecting code for a designated part of the segment 212-1 as shown in the figure, and may be used to trigger error mitigation in the source decoder 122. As in FIG. 2A, the designated part of the segment 212-1 includes the above-noted information identifying the source coding mode used for the frame. Again, the placement of the CRC boundary as indicated by the vertical dashed line in the figure is by way of example only, and in other embodiments may extend into segments 212-2 or 212-3.

In the frame 210, the first segment 212-1 and the CRC check bits 214 are protected by the first RCPC code $C_1$, the second segment 212-2 is protected by the second RCPC code $C_2$, and the third segment 212-3 is protected by the third RCPC code $C_3$ terminated by the tail bits 216, where the codes $C_1$, $C_2$ and $C_3$ are the same codes used in the FIG. 2A example. Although the tail bits 216 terminate the code $C_3$ in this example, tail bits could alternatively terminate code $C_2$ if code $C_3$ is a rate 1 code, i.e., if code $C_3$ is configured to provide no error protection.

The channel-coded frame 210 is channel decoded using the above-noted reverse decoding method, in which Viterbi decoding in decoder 124 starts with the most powerful RCPC code $C_1$ and ends with the tail bits 216.

A more particular example of a channel error protection profile suitable for use with the frame 200 of FIG. 2A will now be described. Those skilled in the art will be able to determine in a straightforward manner similar profiles for use with frame 210 of FIG. 2B, and for other frame formats in accordance with the invention.

In this example, the total available channel resource is assumed to be 42 kbits/sec. The multi-mode source encoder 110 is assumed to be the previously-described MTPC encoder. The MTPC encoder and channel encoder 112 operate on frames of 20 ms; i.e., frame 200 of FIG. 2A is assumed to represent 20 msec of information. The example is optimized for an additive Gaussian white noise (AWGN) channel at approximately 0 dB SNR, where the SNR is defined in this case as the ratio of the transmitted signal energy to the noise energy.

The MTPC coder in this example operates at source bit rates of between 19.60 and 23.55 kbits/sec. The source coding rate is different for the two modes. The inner channel codes used are the memory-4 RCPC codes described in the above-cited reference J. Hagenauer, "Rate-compatible punctured convolutional codes (RCPC codes) and their applications," IEEE Transactions on Communications, Vol.36, No.7, pp. 389–400, April 1988. The memory-4 codes require a tail bit overhead of 4 bits. The outer channel code is a (25, 20) CRC code, i.e., the CRC covers 20 bits with 5 CRC check bits. These check bits represent additional overhead.

A given channel protection profile may be described by specifying the RCPC codes $C_1$, $C_2$ $C_N$ by their rates $R_1$, $R_2$ ... $R_N$, and by specifying the number of source bits, $n_1$, $n_2$ ... $n_N$, that are protected by each of the codes. In this example, both the CRC check bits and the tail are protected by $C_1$. The following error protection profiles have been determined via simulation to perform well given the assumed AWGN channel condition and transmitted rate requirement. The profiles each use n=3 different RCPC codes, as previously described in conjunction with FIG. 2A.

| MODE | Source rate | $R_1$ | $n_1$ | $R_2$ | $n_2$ | $R_3$ | $n_3$ |
|---|---|---|---|---|---|---|---|
| Speech | 23.55 kbits/s | 8/20 | 41 | 8/18 | 228 | 1 | 202 |
| Audio | 19.60 kbits/s | 8/22 | 91 | 8/20 | 176 | 1 | 125 |

The total number of bits in each profile is $(R_1 \times (n_1+5+4))+(R_2 \times n_2)+(R_3 \times n_3)=840$. This corresponds to a total bit rate of 42 kbits/sec given the 20 msec frame size.

It should be noted that the similar source coding rates and the different error protection profiles in the above example will generally prevent conventional algorithms, such as the rate detection algorithm of the above-cited E. Cohen and H.-L. Lou reference, from being a viable option for differentiating modes.

In decoding the channel-coded frame 200 of FIG. 2A or the channel-coded frame 210 of FIG. 2B, the channel decoder 120 must attempt to determine the particular source-coding mode that was used, since that determines a corresponding error protection profile and thus the particular RCPC code arrangement used in the channel encoder 112.

Example decoding processes of this type will now be described in conjunction with the flow diagrams of FIGS. 3A, 3B, 3C and 4. For these examples, it will be assumed that there are two different source coding modes, e.g., a speech coding mode and an audio coding mode, each with a corresponding error protection profile, although the invention can be extended in a straightforward manner to accommodate any desired number of source coding modes. It should be noted that the CRC length need not be the same for both modes. Moreover, different CRCs may be used for the different modes.

Figure 3A:
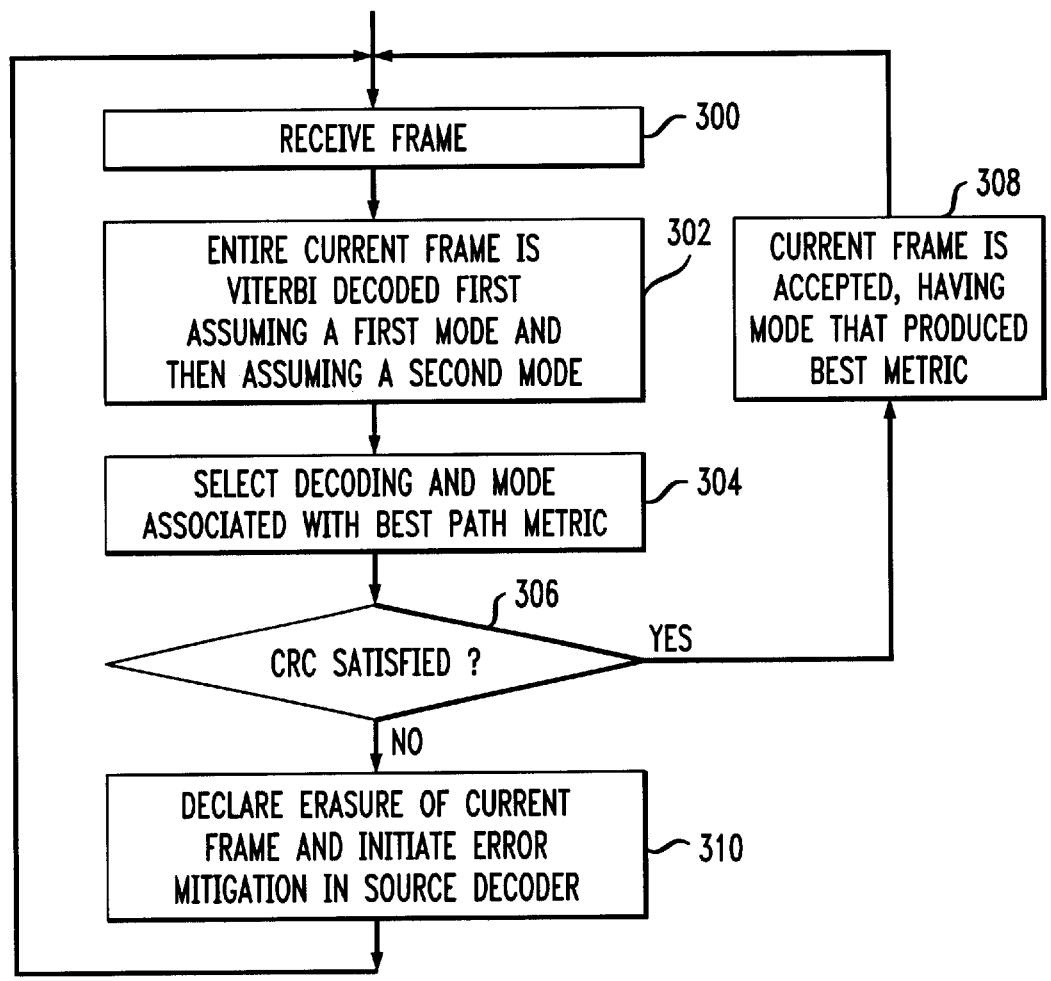
FIGS. 3A, 3B, 3C and 4 are flow diagrams showing decoding processes that may be implemented in the system of FIG. 1 in accordance with the invention.

Referring to FIG. 3A, in step 300, a given channel-coded frame is received in the channel decoder 120 of receiver 104. This frame is referred to as the current frame. The entire current frame is Viterbi decoded as indicated in step 302, first assuming the first source coding mode and its corresponding error protection profile, and then assuming the second source coding mode and its corresponding error protection profile. The decoding and associated mode that produced the best path metric are selected in step 304, and in step 306 a check is made in CRC decoder 126 as to whether or not the corresponding CRC is satisfied. If the CRC is satisfied, the current frame is accepted, and the assumed mode that produced the best path metric is accepted as the proper mode for the current frame, as indicated in step 308. The process then returns to step 300 to await the next frame. The path metric values are thus used to hypothesize a particular source coding mode for the current frame, and the CRC is used to verify the hypothesis. If the CRC in step 306 is not satisfied, the process continues to step 310 in which an erasure of the current frame is declared, and error mitigation in the source decoder 122 is initiated. The process then returns to step 300 to await the next frame.

The FIG. 3A decoding process represents a basic robust algorithm suitable for use in the system of FIG. 1. Example modifications of this basic robust algorithm are shown in FIGS. 3B and 3C.

Figure 3B:
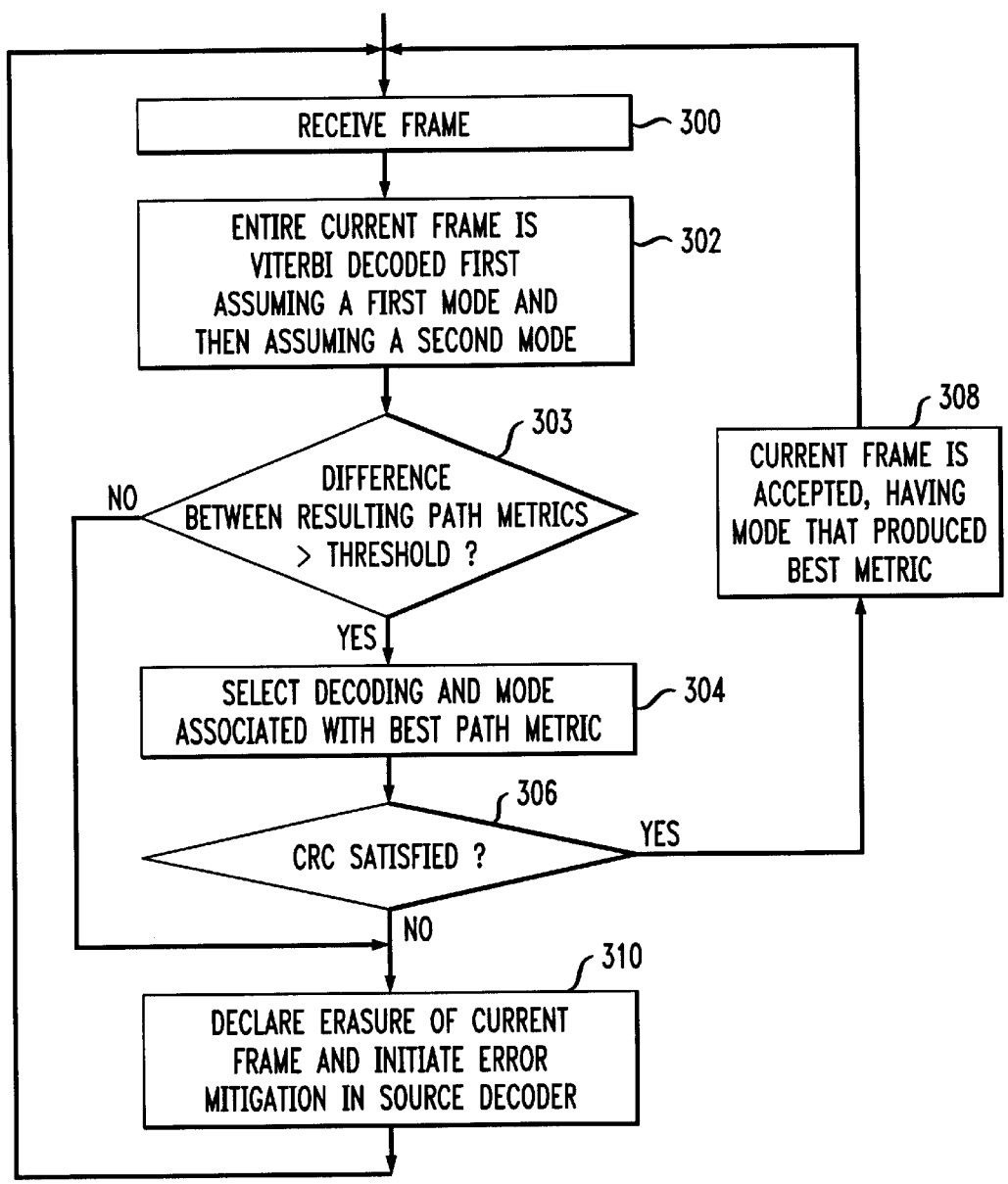

The FIG. 3B process includes steps 300, 302, 304, 306, 308 and 310 as previously described in conjunction with FIG. 3A, and further includes an additional step 303 between steps 302 and 304. In step 303, a difference between the resulting path metrics for the two modes is compared with a threshold. If the different is greater than the threshold, the decoding and associated mode that produced the best path metric are selected in step 304, and the process continues as in FIG. 3A. If the difference is not greater than the threshold, the process moves to step 310 to declare an erasure of the current frame and initiate error mitigation in the source decoder 122. The process then returns to step 300 to await the next frame.

The particular threshold value used in step 303 and values of other thresholds referred to herein may be determined through simulation, in a manner well known to those skilled in the art. These threshold values may therefore vary depending upon application-specific factors such as the particular error protection profiles used in a given embodiment. It should also be noted that the threshold values may be made adaptive, such that different threshold values are used under different conditions, in order to provide a desired adjustment in system performance.

Figure 3C:
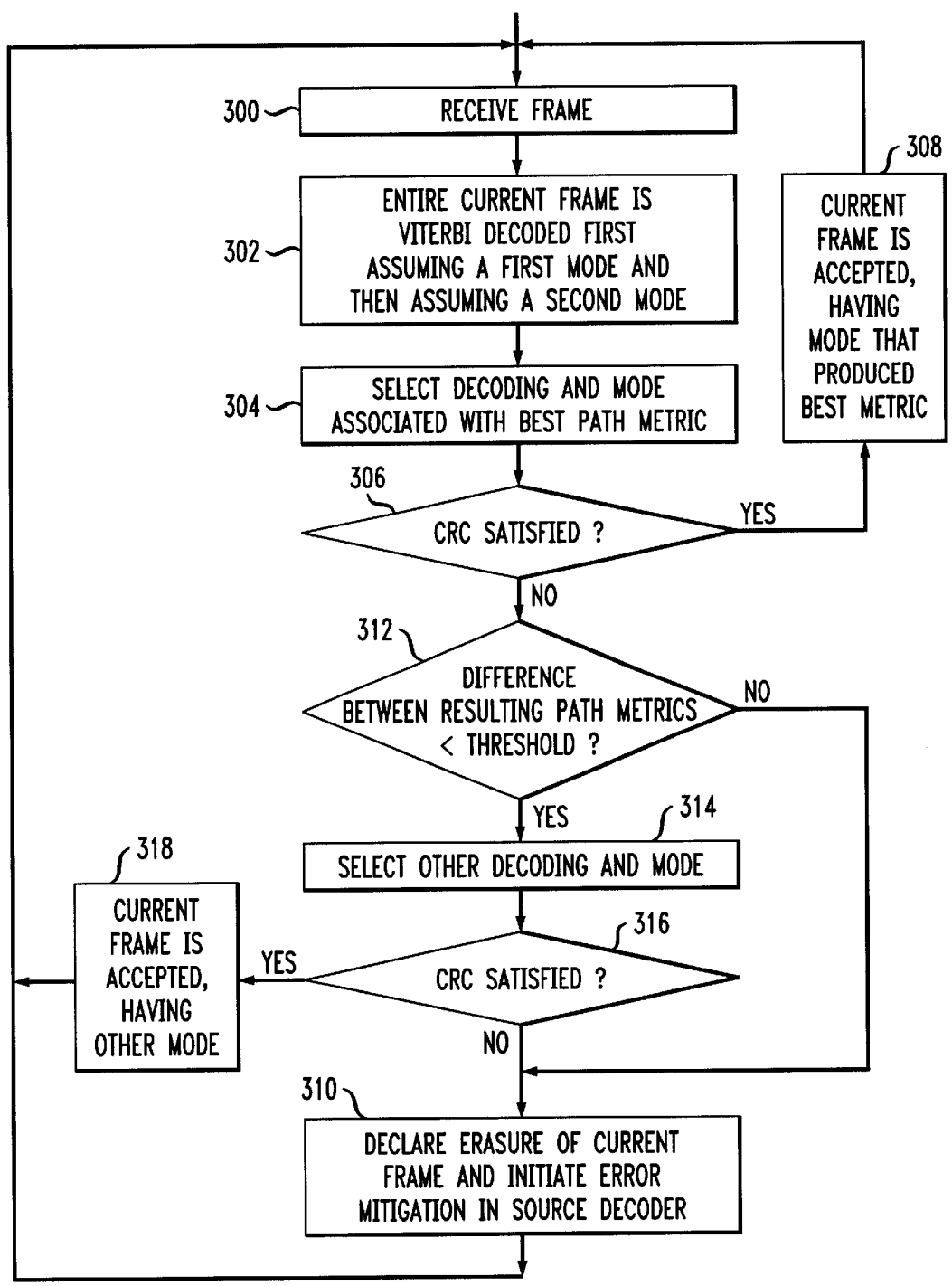

Referring now to FIG. 3C, the process shown includes steps 300, 302, 304, 306, 308 and 310 as previously described in conjunction with FIG. 3A, and includes additional steps 312, 314, 316 and 318 arranged between step 306 and 310. Step 312 is performed if the CRC in step 306 is not satisfied, and involves comparing a difference between the resulting path metrics for the two modes with a threshold. This threshold may have a different value than the threshold used in step 303 of FIG. 3B, although it may be determined in a similar manner.

If it is determined in step 312 that the difference is less than the threshold, the other decoding and its associated mode are selected in step 314. A CRC check is then made in step 316 to determine whether or not the corresponding CRC is satisfied. If the CRC is satisfied in step 316, the current frame is accepted, and the mode that produced the other decoding, and second-best path metric, is accepted as the proper mode for the current frame, as indicated in step 318. The process then returns to step 300 to await the next frame. If the CRC in step 316 is not satisfied, or if the difference between the path metrics in step 312 is not less than the threshold, the process moves to step 310, in which an erasure of the current frame is declared, and error mitigation in the source decoder 122 is initiated. The process then returns to step 300 to await the next frame.

The decoding processes of FIGS. 3A, 3B and 3C are particularly well suited for use in embodiments in which the CRC code is short, e.g., 3, 4 or 5 bits in length. In such situations, the path metric checks implemented in these processes reduce false acceptances of source coding mode that may result when using a short CRC.

In addition, it should be noted that the FIG. 3C process is particularly well suited for use in embodiments in which the codes used for the different error protection profiles are sufficiently close by design.

Figure 4:
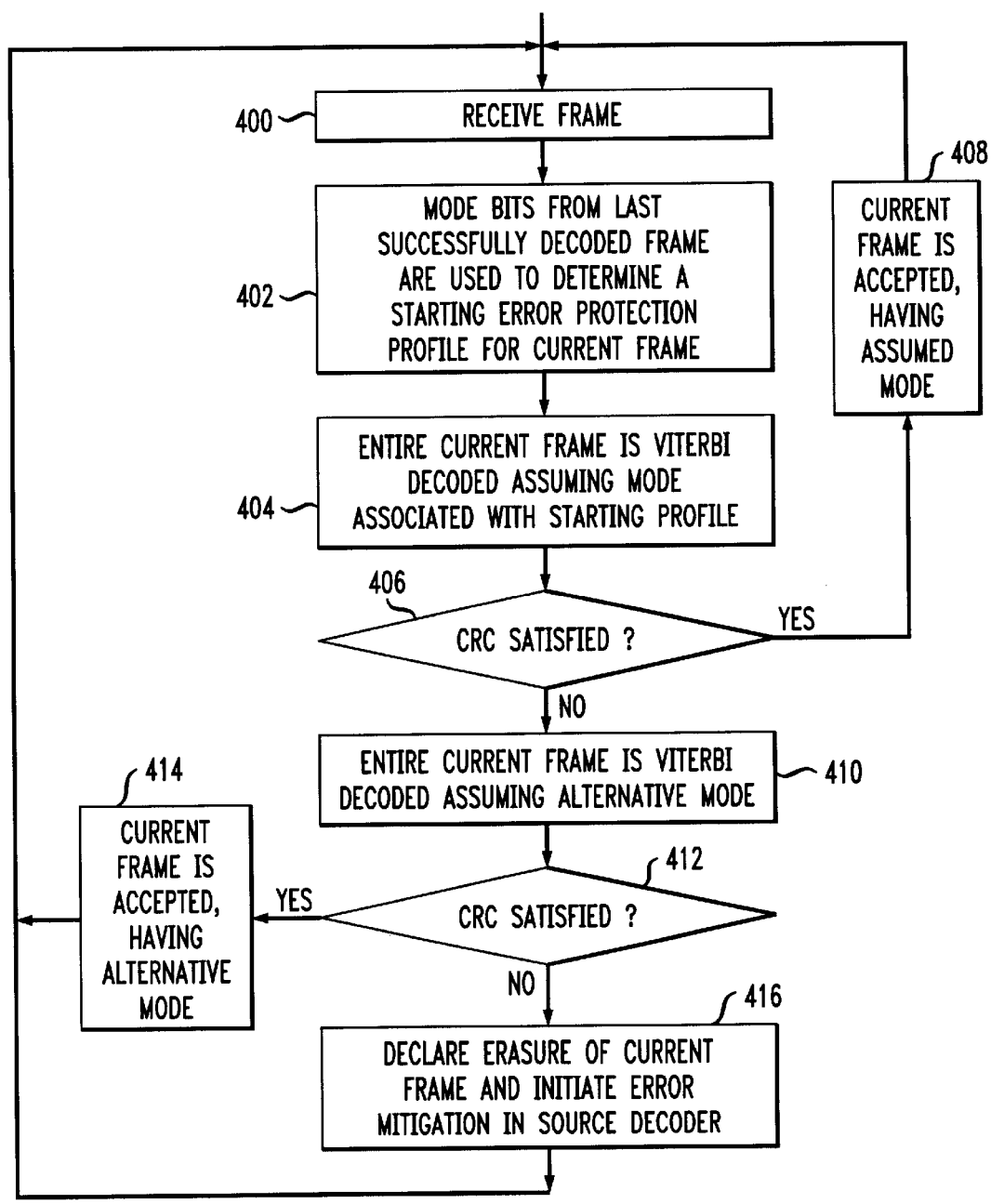

FIG. 4 shows an alternative decoding process in accordance with the present invention. This process does not include the path metric checks of FIGS. 3A, 3B and 3C processes, and is well suited for use in embodiments of the invention that include a longer CRC, e.g., substantially more than 5 bits, which would have a low false acceptance rate for randomly-corrupted information, or in embodiments in which the channel code $C_1$ protecting the source mode bits is the same for all modes. In the latter type of embodiments, the decoding of the channel-coded information using any of the channel error protection profiles for the different modes could lead to valid decoding of the portion of a frame containing the mode bits. The rest of the channel-coded frame corresponding to portions covered by $C_1$, $C_2$, etc. would in general be in error and randomly corrupted if the wrong channel error protection profile is assumed for channel decoding.

In step 400 of FIG. 4, a current frame is received. The mode bits from the last successfully decoded frame are then used in step 402 to determine a starting error protection profile for the current frame. This starting profile represents a hypothesis of a source coding mode for the current frame. In step 404, the entire current frame is Viterbi decoded in decoder 124 assuming the starting error protection profile and its associated mode. In step 406, a CRC check is made, and if satisfied the mode hypothesis has been verified and the current frame is accepted, as indicated in step 408, and the process returns to step 400 to await the next frame. In other words, the assumed starting error profile and its associated mode are assumed to be correct for the current frame based on the result of the CRC check in step 406.

If the CRC in step 406 is not satisfied, the entire current frame is Viterbi decoded assuming an alternative mode and its corresponding error protection profile, as indicated in step 410. In the present two-mode example, the alternative mode, i.e., the mode not associated with the starting error protection profile, is now hypothesized to be the correct mode for the current frame. A CRC check on the Viterbi decoded frame is performed in step 412, and if satisfied the current frame is accepted as having the alternative mode as indicated in step 414, and the process returns to step 400 to await the next frame.

If the CRC in step 412 is not satisfied, the process moves to step 416, in which an erasure of the current frame is declared, and error mitigation in the source decoder 122 is initiated.

Figure 5:
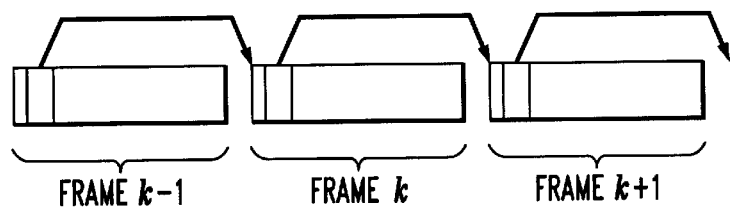
FIG. 5 illustrates an approach in which each frame includes mode bits identifying the source coding mode for a subsequent frame, in accordance with the invention.

An alternative approach to the mode hypothesis approaches of FIGS. 3 and 4 is to transmit one or more extra mode bits in each frame. FIG. 5 shows an example of such an approach, as applied to three frames. The frames are denoted frame k−1, frame k and frame k+1. Each of the frames includes mode bits identifying the source coding mode of the subsequent frame. More particularly, frame k−1 includes mode bits identifying the source coding mode used to implement source coding of frame k, as indicated by the arrow between frames k−1 and k in the figure, and frame k includes mode bits identifying the source coding mode used to implement source coding of frame k+1, as indicated by the arrow between frames k and k+1 in the figure. Mode bits for frame k from the previous decoded frame k−1 can now be used in selecting the decoding setup for the error protection profile for frame k, and so on. This alternative approach has the advantage of simplifying the decoding process, but it introduces delay and error propagation.

Figure 6:
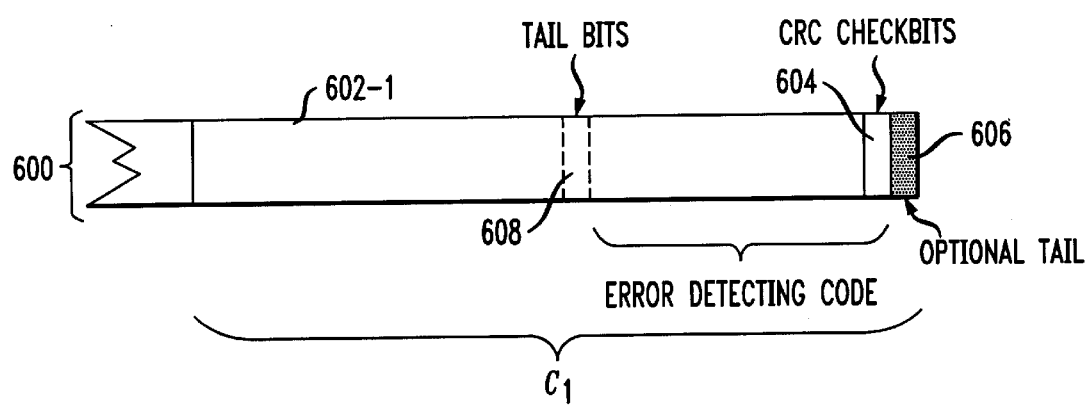
FIG. 6 illustrates another decoding process in accordance with the invention, in which an independent decoding of mode bits may be implemented.

FIG. 6 illustrates another alternative decoding approach which allows independent decoding of the bits protected by the CRC for a given frame, at the expense of an additional set of tail bits. A portion of a channel-coded frame 600 as shown in the figure includes a segment 602-1 and one or more additional segments, CRC check bits 604, a set of optional tail bits 606, and an additional set of tail bits 608. The CRC check bits 604 provide an error detecting code for a designated part of the segment 602-1 as indicated in the figure. The RCPC code $C_1$ that protects the segment 602-1 and the CRC check bits 604 is terminated at the end of the part of segment 602-1 that is protected by the CRC code, using the set of tail bits 608. This allows independent decoding of the CRC-protected bits, which will generally include the mode bits, without decoding the entire frame. Such an approach is particularly well suited for use in implementations in which the number of bits protected by the CRC is large. The frame 600 as shown is configured for a forward decoding method, but this approach can also be used with a reverse decoding method. The need for tail bits such as those shown in FIG. 6 may be eliminated in this approach through the use of tail-biting codes such as those described in R. V. Cox and C.-E. W. Sundberg, "An efficient adaptive circular Viterbi algorithm for decoding generalized tailbiting convolutional codes," IEEE Transactions on Vehicular Technology, Vol. 43, No. 1, pp. 57–68, February 1994, which is incorporated by reference herein. For example, the set of tail bits 606 is denoted as optional because it may be eliminated through the use of a corresponding tail-biting code.

It should be noted that a priori information on inter-frame and intra-frame statistics can also be used to improve the performance of the Viterbi decoder. See, e.g., J. Hagenauer, "Source-Controlled Channel Decoding," IEEE Trans. on Communications, 43(9), September 1995, which is incorporated by reference herein. For example, if the value of transform length indication flag in the MTPC source encoder is 1 (i.e., signaling the audio coding mode), this parameter maintains this value with probability>0.5 for the next frame. This information can be used by the Viterbi decoder to decrease bit error probability. In fact, many of the source-coded bits protected by the CRC in the illustrative embodiment of FIG. 1 show inter-frame and intra-frame dependencies. A reduction in the probability of error for these bits will tend to reduce the frame erasure rate and thus improve performance. Other examples of uses for inter-frame and intra-frame statistics include determining thresholds, determining the number of modes to check, determining suitable modifications to decoding algorithms, etc.

It should be understood that the above-described embodiments are illustrative only. Alternative embodiments of the invention can use different communication system elements, different types of inner and outer codes, different multi-mode source encoders, etc. Furthermore, the relationship between source coding modes and channel error protection profiles may be other than shown in the illustrative embodiments, e.g., there may be different numbers of modes and profiles, such that more than one mode may utilize a given profile, or one of a number of profiles suitable for use with a given mode can be selected for that mode. As noted previously, the invention can be used with types of information other than speech and audio, e.g., image, video, data and combinations thereof. In addition, the invention may be utilized in a wide variety of different types of communication system applications, including communications over the Internet and other computer networks, and over cellular multimedia, terrestrial and satellite broadcast, wireless cable, wireless local loop, high-speed wireless access and other types of communication systems. The invention may be utilized with any desired type of communication channel or channels, such as, for example, frequency channels, time slots, code division multiple access (CDMA) slots, virtual connections in asynchronous transfer mode (ATM) or other packet-based transmission systems, etc. These and numerous other alternative embodiments and implementations within the scope of the following claims will be apparent to those skilled in the art.

What is claimed is:

1. A method for channel coding of information for transmission in a communication system, the information having been source coded in a multi-mode source encoder, the method comprising the steps of:
   determining a mode used by the multi-mode source encoder to source code a designated portion of the information; and
   channel coding the source-coded portion of the information utilizing an error protection profile identified at least in part based on the determined mode;
   wherein at least one channel coding error protection profile is associated with each of the modes of the multi-mode source encoder.

2. The method of claim 1 wherein the designated portion of the information comprises a frame of the information.

3. The method of claim 1 wherein the error protection profile utilized for channel coding of the source-coded portion of the information comprises an outer code operating in conjunction with an inner code.

4. The method of claim 3 wherein the outer code comprises a cyclic redundancy check (CRC) code.

5. The method of claim 3 wherein the inner code comprises a set of rate-compatible punctured convolutional (RCPC) codes.

6. The method of claim 1 wherein the multi-mode source encoder comprises a multimode transform predictive coding (MTPC) encoder.

7. The method of claim 1 further including decoding the channel-coded information by first hypothesizing in a receiver of the system that a particular one of the modes of the multi-mode source encoder was used to source code the designated portion of the information, and then analyzing at least part of corresponding channel-coded information using an error protection profile associated with the hypothesized mode of the multi-mode source encoder to determine if the hypothesized mode of the multi-mode source encoder is an appropriate mode for use in source decoding of that portion.

8. The method of claim 7 wherein the part of the corresponding channel-coded information that is analyzed includes a part containing source mode bits generated for a given source-coded frame of the information by the multi-mode source encoder.

9. An apparatus for use in channel coding of information for transmission in a communication system, the information having been source coded in a multi-mode source encoder, the apparatus comprising:
   a multi-mode channel encoder operative to determine a mode used by the multi-mode source encoder to source code a designated portion of the information, and to channel code the source-coded portion of the information utilizing an error protection profile identified at least in part based on the determined mode, wherein at least one channel coding error protection profile is associated with each of the modes of the multi-mode source encoder.

10. A method for decoding of information transmitted in a communication system, a designated portion of the information having been source coded in a multi-mode source encoder and subsequently channel coded using one of a plurality of error protection profiles selected for that portion based at least in part on the mode of the source encoder used to source code that portion, the method comprising the steps of:
   hypothesizing in a receiver of the system that a particular one of the modes of the multi-mode source encoder was used to source code the designated portion of the information; and
   analyzing at least part of corresponding channel-coded information using an error protection profile associated with the hypothesized mode of the multi-mode source encoder to determine if the hypothesized mode of the multi-mode source encoder is an appropriate mode for use in source decoding of that portion.

11. The method of claim 10 wherein the designated portion of the information comprises a frame of the information.

12. The method of claim 10 wherein the error protection profile utilized for channel coding of the source-coded portion of the information comprises an outer code operating in conjunction with an inner code.

13. The method of claim 12 wherein the outer code comprises a cyclic redundancy check (CRC) code.

14. The method of claim 12 wherein the inner code comprises a set of rate-compatible punctured convolutional (RCPC) codes.

15. The method of claim 10 wherein the multi-mode source encoder comprises a multimode transform predictive coding (MTPC) encoder.

16. The method of claim 10 wherein the particular one of the modes of the multi-mode source encoder hypothesized as having been used to source code the designated portion of the information is selected by performing a Viterbi decoding for each of a plurality of different modes, and selecting the hypothesized mode based at least in part on a result of the Viterbi decoding.

17. The method of claim 16 wherein the hypothesized mode is selected based on which of the modes resulted in the best path metric.

18. The method of claim 10 wherein the particular one of the modes of the multi-mode source encoder hypothesized as having been used to source code the designated portion of the information is selected based in part on mode bits from a previous successfully-decoded frame.

19. The method of claim 10 wherein the part of the corresponding channel-coded information that is analyzed includes a part containing source mode bits generated for a given source-coded frame of the information by the multi-mode source encoder.

20. An apparatus for use in decoding of information transmitted in a communication system, a designated portion of the information having been source coded in a multi-mode source encoder and subsequently channel coded using one of a plurality of error protection profiles selected for that portion based at least in part on the mode of the source encoder used to source code that portion, the apparatus comprising:

a multi-mode channel decoder operative to hypothesize that a particular one of the modes of the multi-mode source encoder was used to source code the designated portion of the information, and to analyze at least part of corresponding channel-coded information using an error protection profile associated with the hypothesized mode of the multi-mode source encoder to determine if the hypothesized mode of the multi-mode source encoder is an appropriate mode for use in source decoding of that portion.

* * * * *